US007835898B2

(12) United States Patent
Geist et al.

(10) Patent No.: US 7,835,898 B2
(45) Date of Patent: Nov. 16, 2010

(54) SATISFIABILITY (SAT) BASED BOUNDED MODEL CHECKERS

(75) Inventors: Daniel Geist, Haifa (IL); Mark Ginzburg, Be'er Sheva (IL); Yoad Lustig, Jerusalem (IL); Ishai Rabinovitz, Haifa (IL); Ohad Shacham, Kfar Monash (IL); Rachel Tzoref, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 1299 days.

(21) Appl. No.: 11/285,338

(22) Filed: Nov. 22, 2005

(65) Prior Publication Data

US 2007/0118340 A1    May 24, 2007

(51) Int. Cl.
*G06F 17/50*  (2006.01)
*G06G 7/62*   (2006.01)
(52) U.S. Cl. .............................. 703/15; 703/14; 716/3; 716/5
(58) Field of Classification Search .................... 703/14, 703/15, 2; 716/3, 5
See application file for complete search history.

(56) References Cited

U.S. PATENT DOCUMENTS

| 6,944,838 | B2 * | 9/2005 | McMillan ....................... 716/5 |
| 7,346,486 | B2 * | 3/2008 | Ivancic et al. ................. 703/22 |
| 7,451,375 | B2 * | 11/2008 | Jain ............................. 714/752 |
| 7,546,563 | B2 * | 6/2009 | Jain et al. ....................... 716/5 |
| 7,711,525 | B2 * | 5/2010 | Ganai et al. .................... 703/2 |
| 2005/0262456 | A1 * | 11/2005 | Prasad ........................... 716/4 |
| 2006/0282806 | A1 * | 12/2006 | Cadambi et al. .............. 716/5 |
| 2007/0011671 | A1 * | 1/2007 | Kahlon et al. ............... 717/170 |
| 2007/0044084 | A1 * | 2/2007 | Wang et al. .................. 717/151 |
| 2007/0299648 | A1 * | 12/2007 | Levitt et al. .................. 703/22 |

OTHER PUBLICATIONS

Katz et al.; Space-efficient bounded model checking; Mar. 7-11, 2005; Proceedings Design, Automation and Test in Europe; vol. 2; pp. 686-687.*
Katz et al.; Bounded Model Checking with QBF; Jun. 2, 2005; Springer Berlin/Heidelberg; Lecture Notes in Computer Science; pp. 408-414.*
R. Rugina and M. Rinard, "Symbolic Bounds Analysis Of Pointers, Array Indices, And Accessed Memory Regions" Mar. 2005, ACM Transactions on Programming Languages and Systems, vol. 27, No. 2, pp. 185-235.*
Ilan Beer et al., "On-the-Fly Model Checking of RCTL Formulas", CAV 1998.
Shoham Ben-David et al., "Model Checking at IBM". Formal Methods in System Design 22(2): 101-108 (2003).
Armin Biere et al., "Symbolic Model Checking without BDDs". TACAS 1999.

* cited by examiner

*Primary Examiner*—Paul L Rodriguez
*Assistant Examiner*—Juan Ochoa

(57) ABSTRACT

A method uses a SAT solver operating to cycle k to find bugs in a model having finite computation paths therein, wherein said bugs are on computation paths of less than length k. Another method includes adding an additional state variable to a model to be checked, where a governing state machine of the additional variable has a "sink" state. The method includes having a translation using the additional variable whenever a state indicates a bad state and performing satisfiability solving with the model and the translation.

2 Claims, 3 Drawing Sheets

```
VAR  xx:0..7;
ASSIGN
    init(xx) := 0;
    next(xx) := case
         xx = 7: 0;
         else: {xx, xx+1};
    esac;

TRANS (xx != 7) or (next(xx) = 2);
```

```
Var AF: Boolean;

init(AF)=0;

next(AF):=
        case
         BAD:1;
           else:AF;//stay the same
        esac;
```

SATISFIABILITY (SAT) BASED BOUNDED MODEL CHECKERS

FIELD OF THE INVENTION

The present invention relates to model checking generally and to satisfiability solvers for model checking in particular.

BACKGROUND OF THE INVENTION

Model checking decides the problem of whether a system satisfies a temporal logic property by exploring the underlying state space. It applies primarily to finite-state models or systems (FSMs) where all the execution paths are infinite. However it can also be conducted on FSMs where some of the execution paths are finite. The state space can be represented in symbolic or explicit form. Symbolic model checking has traditionally employed a Boolean representation of state sets using binary decision diagrams (BDDs) as a way of checking temporal properties, whereas explicit-state model checkers enumerate the set of reachable states of the system.

A path is a maximal sequence of states $(S_0, S_1, S_2, \ldots)$ such that $S_0$ is an initial state and for each two consecutive states $(S_{i-1}, S_i)$ there is a transition from state $S_{i-1}$, to state $S_i$. The path is infinite if this sequence is infinite. The path is finite if this sequence is finite (i.e., there is no outgoing transition from the last state in this sequence). A bounded path is an initial portion of a path of length n, also known as a "prefix" of a path, and is finite.

Reference is now made to FIG. 1, which illustrates a simple, finite state machine of four states (1-4), where the initial state is 4. In the state machine of FIG. 1, there are transitions (indicated by arrows) back and forth from state 2 to each of the other states 1, 3 and 4. In addition, there is a self-loop labeled 8 at state 1. The transition relation in the state machine in FIG. 1 is total (i.e. there is always a transition from one state to another) and therefore, all the paths are infinite paths. For example, there is a path from state 4 to state 2 to state 4 to state 2, etc. If the path passes through state 1, it can either stay at state 1 (via self-loop 8) or it may return to state 2.

In the article, *Symbolic Model Checking without BDDs*, by Armin Biere, Alessandro Cimatti, Edmund M. Clarke, Yunshan Zhu in TACAS 1999, the use of Boolean satisfiability (SAT) solvers for linear-time temporal logic (LTL) properties was explored through a technique known as bounded model checking (BMC). As with symbolic model checking, in bounded model checking, the state is encoded in terms of Booleans. A bounded model checker unrolls the model a bounded number of steps for some bound k, and prepares a translation of the model to be checked with a SAT solver for counterexamples over computations of length k.

The translation being checked is defined as the question, is there a bounded path of length k that contains a bug, where a bug is defined as a Boolean predicate over the state of the FSM. If the translation is satisfied (i.e. the answer to the question is Yes), then there is a bug in the model being checked.

A translation A is defined mathematically as:

$$A = INIT(S_0) \wedge \left( \bigwedge_{i=1}^{k} TR(S_{i-1}, S_i) \right) \wedge \left( \bigvee_{i=0}^{k} BAD(S_i) \right) \quad (1)$$

where INIT, TR and BAD are Boolean predicates which check the status of the variables on which they operate. INIT$(S_0)$ returns True if state $S_0$ is one of the initial states, TR$(S_{i-1}, S_i)$ returns True if transition $(S_{i-1}, S_i)$ is a valid transition of the finite state machine and BAD$(S_i)$ returns True if state $S_i$ is a non-allowed value (i.e. that indicates a bug).

Equation 1 indicates that there is a bounded path of length k such that $S_0$ is in the initial set INIT$(S_0)$, for each two consecutive states $(S_{i-1}, S_i)$ there is a transition from state $S_{i-1}$, to state $S_i$ and the bounded path passes through a bad state.

The SAT solver then attempts to satisfy condition A (i.e. to find a valid bounded path to at least one of the states that satisfies BAD). A brig is defined as a bad state that is reachable by a computation path. The SAT solver typically also generates a counter-example trace leading to the bug.

In practice, the verification engineer fixes the length parameter k, for example, k=10. The bounded model checker produces translation A and provides it to the SAT solver. If the SAT solver determines that the translation is satisfiable, then a bug is found; otherwise, the result is seen as "k-passed" (i.e. the model does not contain a bug on any bounded path up to length k). Some modern verification tools, such as RuleBase, commercially available from International Business Machines (IBM) Corporation of the USA, also provide automatic modes in which the bound k is automatically increased until a bug is found or the system runs out of resources.

SUMMARY OF THE PRESENT INVENTION

The present invention may improve bounded model checking with satisfiability (SAT) solvers, for models with both finite and infinite paths.

There is therefore provided, in accordance with a preferred embodiment of the present invention, a method and an apparatus which uses a SAT solver operating to cycle k to find bugs in a model having finite computation paths therein, wherein the bugs are on computation paths of less than length k.

Additionally, in accordance with a preferred embodiment of the present invention, the method may translate a model to be checked to include an already failed indicator AF for each state of the model and may solve the translated model for satisfiabilty.

Moreover, in accordance with a preferred embodiment of the present invention, the translation includes adding the already failed indicator to a model to be checked, where a state machine of the already failed indicator has a sink state.

Further, in accordance with a preferred embodiment of the present invention, the method also includes removing states succeeding a failed state from the output of the satisfiability solving.

There is also provided, in accordance with a preferred embodiment of the present invention, a method and apparatus, the apparatus includes a translator to translate an input model to be checked to include an already failed indicator AF for each state of said model and a satisfiability solver to check said translated model. The translator operates as described hereinabove and can operate on models with finite or infinite paths therein.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figures 1, 2:
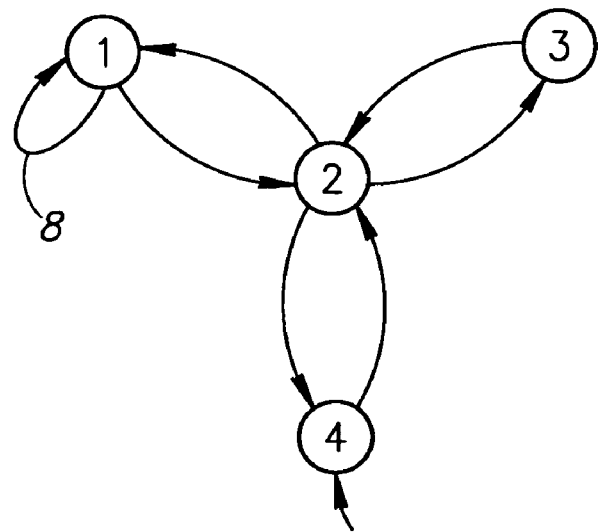
FIG. 1 is a schematic illustration of a simple state machine.
FIG. 2 is an illustration of an exemplary portion of code of a model having a finite path.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicants have noticed that the SAT solver occasionally indicates the lack of a bug when, in fact, there is a bug. This is because Equation 1 asks the question "Is there a bounded path of length k that contains a bug?" and Applicants have noticed that the SAT solver answers the question specifically. That is, the SAT solver will find bounded paths of length k that contain a bug. However, the SAT solver will not identify bugs on paths whose lengths are less than k. This situation may happen when some paths within the model are finite, since, if all paths were infinite, then a bounded path of length less than k may be extended to a bounded path of length k that contains a bug and the SAT solver would then be able to find that extended path.

For example, if there is a bug in a third state of a finite, seven state path, the SAT solver will not find it if the SAT solver was told to find paths longer than 7 states.

Figure 3:
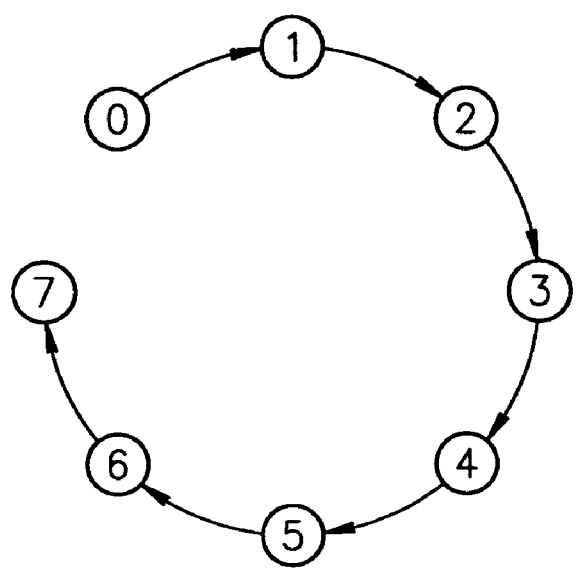
FIG. 3 is a schematic illustration of a finite execution path.

Paths of less than length k exist in models which have finite computation paths. A finite computation path may result from a computation ending in a state for which no other state satisfies the transition relation. An exemplary piece of code with finite paths is shown in FIG. 2 and a finite path for this code is shown in FIG. 3, respectively, to which reference is now made.

The code of FIG. 2 has two sections, an ASSIGN section where calculations are made and a TRANS section which may be added by a verification engineer. The ASSIGN section of the code of FIG. 2 may specify that the variable xx has an initial value of 0, that the variable xx may remain unchanged or may increase by 1 in each cycle and that, in the cycle after xx receives the value of 7, it returns to 0.

The second section of FIG. 2 is the TRANS section. In general, the verification engineer may add the TRANS section to change the code for model checking. The TRANS section may be part of a formal verification environment (testbench) using PSL (property specification language) assumptions. Assumptions are a very important convenience of PSL and make environment writing significantly simpler.

For example, after the model checker finds a bug, but before the verification engineer has time to fix the bug, the verification engineer may put the buggy part of the model into a TRANS section, such that the model checker may ignore this part. The verification engineer may similarly cover a complicated section that s/he knows that the model checker will have difficulty checking. Unfortunately, as explained hereinbelow, the TRANS section often creates finite paths which the model checker then cannot properly check.

In the very simple model of FIG. 2, the TRANS operation adds an additional constraint on the xx variable that mandates its transition to 2 once it has become 7. However, the original model required variable xx to return to 0. Clearly no value can satisfy both constraints. Therefore, the path has no continuation and is thus, finite. FIG. 3 graphically presents a valid path in the model described by FIG. 2. In this path, xx is increased from 0 to 7 and there is no arrow between state 7 and state 0.

One simple solution to the finite paths problem may be to provide multiple questions to the SAT solver (i.e. move k along from 0 to a large number by increments of 1), but this is time and resource consuming.

Figure 4:
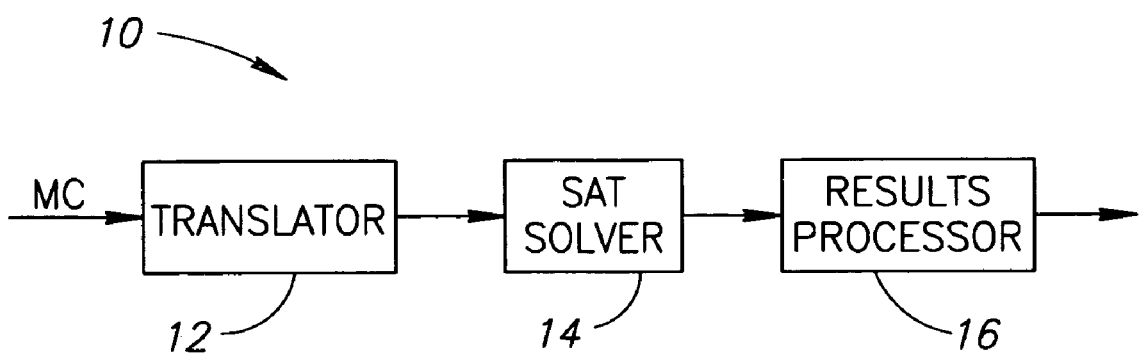
FIG. 4 is a block diagram illustration of a SAT solver, constructed and operative in accordance with the present invention.

Reference is now made to FIG. 4, which illustrates a bounded model checker 10, constructed and operative in accordance with the present invention. Checker 10 may comprise a translator 12, a SAT solver 14 and a results processor 16. Translator 12 may provide a novel translation, discussed in more detail hereinbelow, for an input model. SAT solver 14 may be any SAT solver, such as MAGE, forming part of RuleBase, commercially available from IBM, or CHAFF, publicly available from Princeton University, New Jersey, USA. SAT solver 14 may take the translation, typically provided in a "Conjunctive Normal Form" and may determine if the translation is satisfiable. SAT solver 14 may generate a counter-example which may list the sequence of states leading to the bad state. Unfortunately, as discussed in more detail hereinbelow, the sequence of states after the bad state may not be valid. Therefore, results processor 16 may review the counter example generated by SAT solver 14 and, in accordance with a preferred embodiment of the present invention, may find the cycle in the sequence at which the bad state occurred and may remove from the counter-example all states after it.

Figures 5, 6:
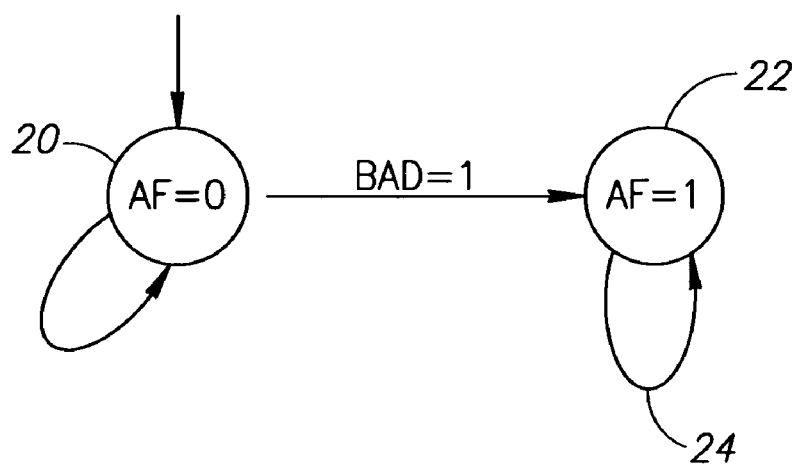
FIG. 5 is an illustration of exemplary code for an AF flag, forming part of the SAT solver of FIG. 4.
FIG. 6 is a schematic illustration of a portion of a state machine utilizing the code of FIG. 5.

In accordance with an embodiment of the present invention, translator 12 may add an additional "Already Failed" state variable AF to the input, where AF(S) indicates the value of state variable AF at state S. State variable AF may have a governing state machine with a "sink" state. FIG. 5, to which reference is now made, provides pseudo-code for state variable AF. FIG. 6, to which reference is also now made, illustrates the state machine operation for state variable AF. In these two figures, the variable BAD (shown without a parameter) indicates that the current state of the model is a bad state (i.e. satisfies the BAD predicate).

The pseudo-code of FIG. 5 indicates that state variable AF begins with a value of 0. AF may change to 1 when the current state of the model is bad (i.e. when BAD=True). In state machine terms (as shown in FIG. 6), when the AF state variable at a state 20 has a value of 0, then there is a transition to a sink state 22. Since sink state 22 has only one output arrow 24, and since arrow 24 leads back to itself, there is no input that will transition it to another state once the state machine reaches this state.

Further, according to the preferred embodiment of the invention, translator 12 may provide a new formula A' for SAT solver 14 to satisfy. Translation A' may be defined mathematically as:

$$A' = INIT(S_0) \wedge \left(\bigwedge_{i=1}^{k} (TR(S_{i-1}, S_i) \vee AF(S_{i-1}))\right) \wedge \left(\bigvee_{i=0}^{k} BAD(S_i)\right) \quad (2)$$

where INIT, TR and BAD are as defined in the Background and AF is as defined in FIG. 5. In effect, AF may identify those locations in the path which have "already failed" (i.e. for whom a bad state has been found in the path).

In another embodiment of the present invention, the constraints on AF may be added directly to the satisfiability problem. Translator 12 may then translate the result into the satisfiability problem. An exemplary set of constraints may be:

$AF(S_0) \leftrightarrow \text{Bad}(S_0)$ $AF(S_i) \leftrightarrow (AF(S_{i-1}) \leftrightarrow \text{BAD}(S_i)) i > 0 \quad (3)$ In other words, a state $S_i$ may be defined as already failed if and only if either it is a bad state or if its previous state $S_{i-1}$ was "Already Failed" and, for an initial state $S_0$ belonging to $INIT(S_0)$, $AF(S_0)$ may be set to $BAD(S_0)$. It will be appreciated that Equation 3 indicates that all states after a bad state may be defined as already failed.

In an alternative embodiment of the present invention, the constraints may be defined differently. In this alternative embodiment, Equation 3 may become:

$AF(S_0) \rightarrow \text{Bad}(S_0)$ $AF(S_i) \rightarrow (AF(S_{i-1}) \leftrightarrow \text{BAD}(S_i)) i > 0 \quad (4)$ Equation 4 is a relaxed version of Equation 3, an "if" statement rather than an "if and only if" statement.

In a further alternative embodiment, the translation of Equation 2 may be simplified to:

$$A'' = INIT(S_0) \wedge \left(\bigwedge_{i=1}^{k} (TR(S_{i-1}, S_i) \vee AF(S_{i-1}))\right) \wedge (AF(S_k)) \quad (5)$$

It will be appreciated that both constraints (equations 3 and 4) may operate with both translations (equations 2 and 5).

It will further be appreciated that the trace that may be generated from the output of SAT solver 14 (using any of equations 2-5) may contain spurious states after the cycle in which a bug occurred. Such spurious states are extraneous and do not provide further information about the location of a bug. Moreover, such spurious states may violate the constraints of transition relation $TR(S_i, S_{i+1})$. Thus, results processor 16 may remove the extraneous bad states from the trace.

In a further alternative embodiment, the translations of the present invention may be used with infinite systems as well. The translations of the present invention may provide better performance (e.g. the SAT solver may find a satisfying assignment faster because when there is a bug in the b-th cycle (for b less than k) the SAT solver does not need to find a valid path for the last (k-b) cycles, and therefore it has better performance.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for finding bugs in a model implemented by a computer comprising:

translating a model to be checked to include an already failed indicator AF for each state of said model, comprising using one of the following equations:

$$A' = INIT(S_0) \wedge \left(\bigwedge_{i=1}^{k} (TR(S_{i-1}, S_i) \vee AF(S_{i-1}))\right) \wedge \left(\bigvee_{i=0}^{k} BAD(S_i)\right)$$

$$A'' = INIT(S_0) \wedge \left(\bigwedge_{i=1}^{k} (TR(S_{i-1}, S_i) \vee AF(S_{i-1}))\right) \wedge (AF(S_k))$$

where $INIT(S_0)$ is a Boolean predicate which checks if the state $S_0$ is one of the initial states and $TR(S_{i-1}, S_i)$ is a transition relation from a previous state $S_{i-1}$ to current state $S_i$, solving said translated model for satisfiability in order to find said bugs, wherein said indicator AF is defined as one of the following:

$AF(S_0) \leftrightarrow \text{Bad}(S_0)$ $AF(S_i) \leftrightarrow (AF(S_{i-1}) \leftrightarrow \text{BAD}(S_i)) i > 0$ and $AF(S_0) \rightarrow \text{Bad}(S_0)$ $AF(S_i) \rightarrow (AF(S_{i-1}) \leftrightarrow \text{BAD}(S_i)) i > 0$ where $AF(S_i)$ is said indicator for a current state $S_i$, and $BAD(S_i)$ is a Boolean predicate representing the bad states.

2. A method implemented by a computer comprising:

using a SAT solver operating to cycle k to find bugs in a model having finite computation paths therein, wherein said bugs are on computation paths of less than length k, wherein said using comprises:

translating a model to be checked to include an already failed indicator AF for each state of said model, comprising using one of the following equations:

$$A' = INIT(S_0) \wedge \left(\bigwedge_{i=1}^{k} (TR(S_{i-1}, S_i) \vee AF(S_{i-1}))\right) \wedge \left(\bigvee_{i=0}^{k} BAD(S_i)\right)$$

$$A'' = INIT(S_0) \wedge \left(\bigwedge_{i=1}^{k} (TR(S_{i-1}, S_i) \vee AF(S_{i-1}))\right) \wedge (AF(S_k))$$

where $INIT(S_0)$ is a Boolean predicate which checks if the state $S_0$ is one of the initial states and $TR(S_{i-1},S_i)$ is a transition relation from a previous state $S_{i-1}$ to current state $S_i$; and solving said translated model for satisfiability, wherein said indicator AF is defined as one of the following:

$AF(S_0) \leftrightarrow \text{Bad}(S_0)$ $AF(S_i) \leftrightarrow (AF(S_{i-1}) \leftrightarrow \text{BAD}(S_i)) i > 0$ and $AF(S_0) \rightarrow \text{Bad}(S_0)$ $AF(S_i) \rightarrow (AF(S_{i-1}) \leftrightarrow \text{BAD}(S_i)) i > 0 \quad (4)$ where $AF(S_i)$ is said indicator for a current state $S_i$, and $BAD(S_i)$ is a Boolean predicate representing the bad states.

* * * * *